March 10, 1959 G. N. HOWATT 2,876,530

FORMING PRINTED CIRCUIT CONDUCTORS

Filed March 31, 1955

INVENTOR:
GLENN N. HOWATT
BY
Harry M. Saragovitz
ATTORNEY.

United States Patent Office 2,876,530
Patented Mar. 10, 1959

2,876,530

FORMING PRINTED CIRCUIT CONDUCTORS

Glenn N. Howatt, Metuchen, N. J., assignor to the United States of America as represented by the Secretary of the Army Application March 31, 1955, Serial No. 498,458
14 Claims. (Cl. 29—155.5)

The invention relates to methods of forming printed conductors and the like on insulation supports, such as panels, plates or decks, in the assembly of electrical apparatus, employing what are known as "printed circuits." Among its objects it aims to simplify the procedure required to produce a printed electrical conductor on a panel or the like, so that a minimum number of operations is required to produce a highly satisfactory conductor, yet enabling the use of certain well known procedures heretofore employed, but in reduced number and peculiar sequence, and with certain modifications of treatment or operation, by which an improved product is obtained at a reduced cost.

The invention is especially important in the production of modern electronic equipment, which is largely used in radio apparatus, television, guided missiles, electronic computers, various control systems, and otherwise.

The invention is peculiarly valuable in the production of capacitors wherein electrodes are formed on a common surface closely adjacent one another with a narrow space between, as well as for the preparation of a pattern of conductors representing a circuit or part thereof.

It is a special aim of the invention to enable the production of a printed circuit from a stock metal-clad insulation support sheet somewhat similar to that used in the prior process wherein a resist is printed on a part of the area of the metal foil face of an insulation panel and the remainder etched away by use of a suitable solution. But in this case a modification in the production of the stock metal-clad sheet material is peculiarly involved in the improvement effected, and the need for etching is obviated. It is an advantage of my invention that process steps similar to some heretofore used for production of the metal clad insulation sheet material may be used (although in different order) using available metals, or electrical equipment, except with a reduction of the quantity of electricity used, and omission of etching.

It is a most important aim to obviate the step of etching in order to remove undesired metal foil beside the conductor or within the circuit pattern, in the making of printed circuits from metal-clad non-conductor sheet material, and to produce an equally clean, clear, and effective pattern by the single step of stripping off in a single motion or operation the parts to be removed.

Another important aim of this invention is to improve the bonding of the conductive pattern to the insulation sheet material, by controlling the degree of adhesion of a silver suspension coating and the like initially to the support, and then increasing this bond when the printed pattern has been made and isolated.

Additional objects, advantages and features of invention reside in the structure of the product resulting from the procedures hereinafter disclosed as well as in those steps and their peculiar nature, sequence and relationship, apparent in, understood from, or specifically stated in, the following description and accompanying drawings, wherein:

Figure 1 is a perspective view of a typical piece of sheet insulation or base stock material 10 on which there has been applied or deposited (mechanically or otherwise) a layer or cladding of metal 11 such as silver, silver paste, ink, or paint, the thickness of which is exaggerated in the drawing for the purpose of illustration.

Figure 2 is a similar fragmentary view showing the material of Figure 1, upon layer 11 of which there has been deposited (electro-deposited or vaporized) an exceedingly thin layer 12 of metal, say between 0.00005 inch and 0.0005 inch thick more or less. The stock comprising these three laminae may be made up in quantity and used as stock panel material if desired.

Figure 3 shows a portion of a panel which has been cut from stock panel material of Figure 2, and upon the outer layer 12 of which there has been printed a resist pattern 13 defining an electrode conductor to be ultimately formed on the base stock 10.

Figure 4 is a cross section of the panel of Figure 3, upon which a thick or otherwise stronger layer of metal 14 has been applied or deposited directly upon and strongly bonded to the metal layer 12 and to the metal cladding 11 without and around the resist pattern 13.

Figure 5 is a perspective view of the panel as last shown, illustrating how the material 11, 12, 14 around the resist pattern is stripped or peeled off, by tractively raising a corner of the combined three layers, and pulling the overlay and adhering parts between and around the conductors of the pattern, away from the panel base sheet 10, leaving the panel base sheet 10 with a clean surface, on which is sharply defined the electrode or conductor 15, constituted by the parts of layers 11 and 12 which had been over-printed by the resist 13.

Figures 1, 2, 3, 4, 5, 6, 7:
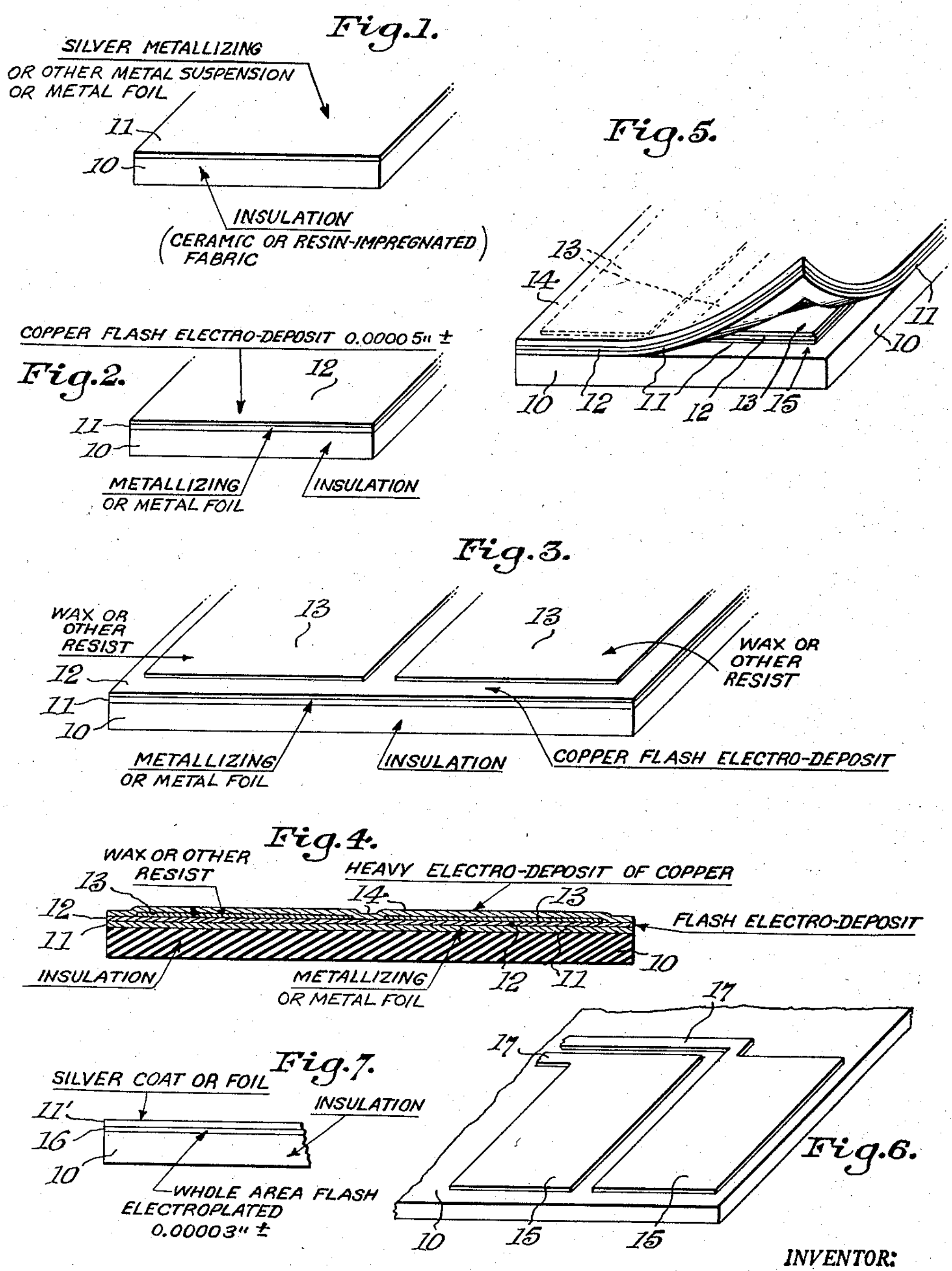
Figure 6 is a formal perspective view of a portion of a panel or deck upon which electrodes 15 have been formed by the practice of my invention.
Figure 7 is a fragmentary view similar to part of Figure 1, showing a modified method and metal-clad stock support material.

Referring more particularly to the drawings, there is shown the before-mentioned base stock support, sheet, plate or deck piece 10 which may be one which has been cut from larger stock to the size for assembly in an electrical apparatus to carry printed circuit components. This base material may be formed of any of a number of materials heretofore available, and preferably of a barium titanate ceramic, especially where used for the dielectric in a capacitor, although some of the synthetic resins or plastics are available also and satisfactory for many situations, as well as resin-impregnated fibrous materials.

Many of these insulation and dielectric materials are suitable for use in my invention without modification of the normal commercial product derived from numerous sources of production, but certain of the synthetic resins and plastics have been found to be improved by subjecting them to a surface treatment by which the surface is grained or roughened as, by sandblasting, and in the case of crystal forms, or ceramic compositions requiring such treatment, by etching the surface to a moderate degree.

The base sheet or panel 10 of proper size ready for application of the metallic first layer 11, may have this layer applied to the whole area of either or both faces of the support by being dipped in a suspension of silver in a vehicle and withdrawn, allowing an excess to drain off; or, a proper layer or layers 11 may be applied, as by pressing a conventional silver paste through a screen and upon the face or faces of the base plate 10. The thickness of the so applied silver paste layer may also be determined by passing the base sheet under a doctor blade. It is practicable also to apply a preformed foil (of any suitable metal) to the base sheet by squeegeeing, with or without a moderate strength evaporable adhesive, according to the requirement of the materials used; or a coat of the chosen metal may be applied by spraying (as for instance, by the Schoop method); or possibly deposited by evaporation. Other methods of applying a conductive metal facing body 11 to the base sheet or support 10 may be employed as found appropriate, and other metals than silver may be employed, either in paste, or paint form, or otherwise applied, as found desirable. It will appear from the foregoing and from the reference hereinafter to the application of and function of coatings or layers 12 and 14, that the layer 11, in whatever form, is to be secured to the base support or panel 10 with a moderate degree of adhesion as compared to its adhesion to a film 12, or the overlay 14, hereinafter described, which forms a stripping coat, layer, or sheet, by which unprinted parts are separated from the base support, or panel 10.

In this specification the term "foil" is used to designate a sheet of pure metal integral throughout, distinguished from one formed by application of a coat of metal particles in suspension in and united by a vehicle as in the case of the silver suspension described in one form of the layer 11.

In case the layer 11 consists of an applied paste, paint, or the like, it is dried or otherwise formed. Or, instead of a mere drying, the sheet with the applied silver or silver paste layer 11, may be passed through a drier and maturing oven, and raised to a temperature sufficient to mature the silver coat in part or completely, to a homogeneous solid substantially pure silver conductor body united with, and more strongly bonded to, the base sheet 10. If such maturing is not carried out at this particular time in the production of the cladded panel stock or sheet, the oven-maturing or firing may be a later or final step in the preparation of a printed circuit on a panel, before placement of circuit components. This and other methods of attaining improvement of conductivity of the final conductor pattern and improved bonding to the panel support are well known, including electrodeposition of added metal on the printed circuit. Both are described in National Bureau of Standards circular 192, pages 6, 15, 16, 39. Such methods may be comprised as steps designated in the appended claims by terms such as "increasing conductivity," and/or "increasing the base bond," and "integrating the metal," particularly in connection with the layer 11. Other metals may be employed, or two or more used in the paste mixture, or in an alloy, or applied in succession as found desirable and/or practicable to form the layer 11 as a stratum or as strata of several.

The single material or composite layer 11 (inclusive of film 12 in one case) having been completed as far as desired at this stage, it will be found to adhere firmly with a moderate bond (compared to others hereinafter described) to the base sheet 10 at normal (room) temperatures, yet be capable of clean separation therefrom by manual or mechanical traction. However, in its simple condition especially before oven-maturing above described, the cohesion of the silver suspension coat within itself is insufficient to permit it to be peeled off in a unitary body, which is an aim of this invention. This weakness has been found true of silver after oven-maturing, when the bond to the base is stronger.

The next steps in my process aim to strengthen the layer 11 in part, especially when composed of a metal suspension, by increasing its net dry tensile strength and the cohesion (at room temperature) of parts of the layer mutually adjacent each other, in directions parallel to the subjacent face of the base sheet 10. This has been done in the practice of my invention by electro-depositing an exceedingly attenuated film 12 of copper or other suitable metal upon the whole area of the layer 11, although the film 12 may be produced by cathode sputtering or other vaporized metal depositing, using copper or other metals such as aluminum, zinc, cadmium, or other, capable of being torn or shear-severed while at normal temperatures along clear, clean edge lines without the use of an edge tool or other cutting or shearing tool. Copper, preferred for the film 12 will have tensile strength per unit of cross section much greater than the corresponding value of a metal suspension material (especially silver, as preferred) in the conductive facing body or layer 11, and the same is true to a lesser degree as to foil of tin, lead, cadmium or zinc. At the same time, this layer 12 is more adherent to the layer 11 than the layer 11 is to the base sheet 10, which becomes important in connection with later steps in my procedure. Metals of greater tensile strength and shear resisting strength than copper may be employed in layer 12 if sufficiently adherent to the layer 11 and provided they are of attenuations such as will permit them to tear easily, and consequently tear with clean edges (that is, with smooth edges) along border lines of conductors and avoiding fringe material at the line of tear (which has been a serious difficulty in prior efforts to perfect stripping of such areas). The layer 11 and film 12 are thus combined and united to constitute a conductive face body of metal over the whole printable area of the base panel or support 10, whether formed of the silver suspension described, or of a foil sheet deposited or applied as heretofore indicated. The term "exceedingly," applied to the tenuity of film 12 is relative to deposits or foils intended as essentially conductive materials, and it will appear from the description that it is not depended on materially as a conductor.

As before indicated, a laminated or single base sheet having the two layers 11 and 12 thereon as described to this point may be produced in quantity in large stock sheets from which decks, plates or panels may be cut as needed. In case pure metal foil alone forms the whole of layer 11, the film 12 may not be required additionally unless the foil initially applied is very thin or is of metal very weak at the working temperature prevailing during the stripping operation.

The plate cut to the requirement of a particular instrument or installation, and consisting of the three laminae 10, 11 and 12, with the metal on at least one face as described, is now ready for the formation of a conductor in a printed circuit. The conductor is defined by printing on the face of the layer or film 12 last named a resist pattern 13, which in the present instance may consist merely of the contours of one or more electrodes and their included areas, defined in a waxy, or bituminous, impervious and/or waterproof preferably water repellant ink, or paint, and/or at least non-adherent to any metal which may be deposited thereover and on the portion of the layer 12 exposed after printing of the resist pattern 13. This resist pattern in the present instance represents two or more electrodes 15 of Fig. 6 with narrow separation of their mutually adjacent boundaries.

The resist 13 having been printed and completed as required, the base sheet 10 with the superposed layers 11 and 12, and with the printed resist pattern 13 above all, is now submerged in the electrolyte of an electroplating apparatus and subjected to a proper plating current, in series with an anode of the desired metal. A layer 14 of the anode metal is thus deposited upon the exposed attenuated film 12 in such manner as to unite therewith or become fastened thereto and to the layer 11 with a bond superior to the bond between the silver or other metal layer 11 and base sheet 10. The metal of the anode in the last mentioned operation, and consequently for the layer 14, is selected for its congruency with, affinity for, and/or adaptability to unite or bond with the material of film 12 and layer 11 with a bond superior to the bond between layer 11 and the base panel or support 10; and with adequate tensile strength for the peeling and stripping use indicated. The bond ratio or difference between the base bond and the bond between layers 11 and 14 may be regulated by choice of metal for layer 14 and film 12, and/or by choice of the proper adhesive in the metal suspension vehicle for layer 11 or the adhesive between foil at 11 and base 10, as the case may be. Copper is effective in all cases with the metals named herein, and is usually preferred because of adequate tensile strength, ready availability and workers' familiarity with practice in its effective electrodeposition. The deposit at 14 is carried to a thickness sufficient to give it the aggregate tensile strength required in the stripping operation here involved (overbalancing the shear strength of the layer 11, or 11 and 12, multiplied by the number of lines along which shear must be effected in the stripping operation, plus the aggregate of adhesion between base and layer 11 along the line at which the base and layer 11 are parted. This forms a ribbon or sheet of metal of high tensile strength added to the silver or other metal in layer 11, and to the layer 12, without—that is, outside—the bonds of conductors defined in the resist pattern 13. This deposit 14 having been completed to the desired thickness and strength, the sheet or panel is removed from the electrolyte, cleaned and dried, after which the edge of the entire assembly of layers and deposits 11, 12, 14 at the boundary of the base sheet 10 is loosened or pried up, lifted and pulled backwardly and divergently from the base sheet 10. The whole area (or areas) of these three applied layers bounding the conductors defined in the resist pattern 13 is thus tractively peeled and stripped from the sheet 10 as one piece by pulling them from the sheet 10 in a direction divergent from the base sheet at an angle of ninety degrees, or less, in the direction of the still attached parts thereof. In consequence, the parts being removed are so drawn outward from the base 10 as to readily shear the layers 11 and 12 at the lines defining the division between the resist pattern 13 and the parts not covered by resist. The unprinted areas of the panel are thus left clean and nonconductive.

In this stripping operation the top metal layer 14 exerts no appreciable pull on the resist 13 by adhesion between the resist and layer 14, but the portion of the silver composition 11 immediately beside the resist becomes an integral body with the layer 14 and so acts as a shearing member, cutting through the material of and shearing the layers 11 and 12 at the line defining the adjoining portions 11 and 12 underlying the resist and held securely to the base 10. The resistance of layer 11 to shearing or tearing as it occurs in this operation may be called its shear strength.

It has been found that in this operation the separation of the part to be removed from the part to be retained as defined by the resist 13 occurs like a clean cut, without irregular fringe portions, or other irregularities at the edges, and that no finishing of the conductive pattern by the application of a cutting blade to such edges is required before, during, or after stripping, to complete a printed conductive pattern of good workmanship. It is ready for assembly with other parts, components or elements, and procedures to complete an electrical device or circuit detail in accordance with practices already known and practiced in the art. Thus, a second electrode may be applied to the opposite face of the base sheet 10 in registry with or properly lapping the one defined at 15, by the application of layers such as those 11, 12, print 13 and overall foil or overlay 14, with a repetition of the stripping procedure above described, so that a capacitor is formed consisting of two opposite electrodes like the ones 15 derived by the first stripping procedures, with an interposed dielectric consisting of part of the base sheet 10.

The liquid suspension of silver used for dipping or otherwise coating the sheet 10 to form the layer or layers 11 may be of a composition usual for silver paints, ink and/or silver pastes used heretofore in printing conductive patterns on panels in the production of printed circuits, such compositions being disclosed in a number of publications such as, for instance, National Bureau of Standards Publication No. 192 and Circular No. 468 of the National Bureau of Standards, as well as being commercially available from numerous sources. Prior known procedures in built-up multilayer capacitors may also be combined with production steps outlined above, as found desirable or expedient. The pastes and inks usually include a flux for the metal therein and a vehicle binder which is volatile at the temperature required to mature the silver component to the solid or homogeneous condition, and ceramics customarily available commercially or producible as panel plates in accordance with well known practices either patented or commercially in use are of a nature such that silver readily fastens thereto with an adequate bond when the silver is molten.

As before stated, the base sheet 10 may consist of a ceramic plate of any approved ceramic, such as barium titanate, of which formulas are disclosed in my prior Patents Nos. 2,486,410 and 2,582,993, as well as in the patents to Wainer Nos. 2,377,910, 2,436,839, 2,399,082, 2,402,518 and others. Or the base 10 may consist of a melamine-impregnated fabric, or a phenol resin-impregnated fabric, or a plate of one of the appropriate thermosetting plastics. Some thermoplastic materials may be used with proper provision to preserve form and dimensions when the silver is matured as mentioned. The silver or other conductor metal chosen for the layer 11 may be sprayed on the thermoplastic sheet by the Schoop process without deterioration of the base sheet, and thus a metallic layer formed in the first step of application without requiring the maturing step in most cases, if not all. The Schoop process may also be used on resinous sheet material 10, as well as on ceramic base sheet 10 material.

The remaining steps above recited to complete a deck or panel as a component of an electronic or other electrical assembly may be carried out at room temperatures, as is well understood.

Procedures in the production of either the ceramic base piece 10, or to produce the base sheet material by the use of any of the other materials above indicated are all well understood in the art and require no presentation herein to enable practice of the invention by those versed in the art.

In the use of some materials in the base sheet 10, it may be found desirable to omit the firing to mature the silver before printing the resist 13 and depositing the foil 14, but to effect this firing after the stripping operation has been carried out; the succession of steps otherwise being the same as recited above. As is known, the firing improves the conductivity of such printed conductor, and also increases the bond between the conductor and the base support. It is also known to achieve the same ends for silver paste and other coats by electroplating the initially printed circuit with a metal of high electrical conductance. In one procedure where a silver suspension forms the conductor layer 11 a deposit of copper is first made thereon, followed by a deposit of silver. These practices are described in National Bureau of Standards Circular 192, pages 6, 15, and 39. In the appended claims the prior procedures above referred to for firing the layer 11, or reinforcing it, may be comprised as examples of steps under terms such as "increasing the conductivity of the principal layer"; or "increasing the bond of the principal layer to the base"; or "augmenting the conductivity of the principal layer"; or "augmenting the bond of the principal layer to the base," and "integrating the metal."

It may be found desirable with some metal suspension compositions employed in the layer 11, or with all materials of the layer 11, to first vapor-deposit, or otherwise produce an exceedingly tenuous film 16 of metal on the base sheet 10 before applying the silver or other metal material to the sheet 10, as indicated in Figure 7. The film 16 then serves to hold the applied silver or other metal material to the plate 10, if that be necessary, but also to avoid too strong a preliminary bond of the layer 11 as applied, or of the matured silver body to the base support 10. This deposit 16 in such a tenuous form or condition may at its minimum quantity be more or less reticular (or mosaical) depending on how short the duration of the electrolysis, the voltage applied, and nature of the electrolyte.

It will be understood that the denser the deposit 16, the greater will be the adhesion to the support 10, and in consequence, at the same time that it serves to hold together the layer 11 increasing its tensile strength, it determines or controls also the tenacity of attachment of the latter to the support 10, according to the amount of metal deposited in the film 16.

As is well known, printed circuit practices common at present employ a stock material commercially available which corresponds to the base stock 10 of my invention, upon which there has been electrolytically deposited or otherwise applied a foil of tin, copper, zinc, aluminum, or other metal or alloy, the bonding of which to the base or support is largely proportionate to the thickness of the deposit, although aluminum for a given thickness is somewhat superior to copper in bonding to the base insulation most largely used. Copper is the preferred foil for cladding a support or panel in the prior art and the thickness of the copper deposit heretofore used for insulator cladding as stated ranges from 0.0007 inch to 0.0094 inch or more, according to the use contemplated. While the present invention does not necessarily employ metal-clad stock with such range of thickness of electrolytic deposit, the prior practice is preferred to in order to make apparent a radical departure in the use of an electrolytic deposit at 12.

The amount of metal deposited to form the film 12 cannot be readily measured because of its tenuity, but may be said to be about or in the neighborhood of 0.00005 inch to 0.0005 inch more or less. In practice the deposit has been formed by suspending the printed panel in an electrolyte which may, for example, be a typical plating solution consisting of say, 24 parts of copper sulfate, 6 parts sulfuric acid, 2 parts glue (if the latter is considered necessary as a brightener), to 100 parts of solution; and applying a suitable current across the anode and cathode, a current density of between 25 and 50 amperes per square foot of plated surface having been employed. The duration of the electrolysis depends on the current density and plated area, but has been in one instance approximately one minute, within the density range per square foot stated. This may be called a "flash deposit" since it is of extremely short duration compared to the time which would be required to effect deposit of the conventional foils or coatings first above mentioned, with the same bath and current density. Other known electrolyte, and appropriate duration of deposit suited to the case may be used, as found desirable or expedient.

In the case of the film 16, the deposit may be even less. Thus, it may be sufficiently tenuous for the subsequently applied silver paste or paint to effect some hold or bond directly to the support insulation 10 either by penetration of the deposit 16, or by low temperature alloying therewith below the melting points of the silver and copper or other metals when maintained for a sufficient time at a temperature favoring intercrystalline permeation or mutual diffusion of the metals without conventional fusing to an alloy.

This combining or diffusing of the metals into each other may be understood from the disclosure of the practice given in the patent to Williams, No. 2,443,756 dated June 22, 1948.

In regard to the determination of the proper thickness of the flash deposit 12 and/or the one 16, it may be noted that tests of the bond strength of electro-deposited copper on phenolic resins has shown the following values at room temperatures:

| Material of Cladded Stock | Thickness of Deposit, Inch | Average Pull to Separate 1" width foil, pounds |
|---|---|---|
| Paper base, phenolic resin impregnation | 0.0014 | 5 to 8 |
| Do | 0.0028 | 7 to 9 |

The bond strength on a panel will also vary with the nature of the resin used as the impregnant. Thus, 0.0014" copper foil on a silicone resin-impregnated sheet has shown a somewhat better bond, of the order of 6 to 9 lbs. pull required to separate a one inch ribbon of copper from the insulation base support. Commercial and other adhesives are available, if required, to determine the value of the bond between the applied and/or deposited metals and the insulation base support; and/or between the electro-deposited metal and the conductor layer 11 or 11'. Thus, the bonding of the silver paste as such to the insulation base 10 (which may be termed the base bond) may be controlled by using the binder of the paste a properly adherent component which will vaporize—sublimate—at the temperature to which the product is brought (fired) in order to perfect the silver conductor.

The product of the procedures above outlined is a panel having thereon conductors, and in Figure 6 these are shown as two electrodes 15, side by side, on one face of the panel insulation support 10, which remain after the stripping operation described. Various means for applying or forming terminal leads for these may be used, and in the particular case, for convenience extensions 17 from the electrode rectangles 15 are shown, constituting printed conductors integral with the electrodes, and formed simultaneously therewith in and by the steps above set forth.

These electrodes 15 may be used as the lowermost of a series to form a stacked capacitor, carried by the support 10. Alternate layers of ceramic or other plastic dielectric material and electrodes applied by screen stencil may be built up as shown in the Deyrup Patent 2,398,176 and others, or otherwise.

I claim:

1. In the production of printed electrical circuits wherein a conductive pattern of metal is formed on a base panel support of insulation material, the steps of forming over the whole of a predetermined pattern area on a face of the support an uninterrupted principal layer of conductive metal of a predetermined minimum adhesion to the support and of low shear strength and low resistance to tear stress, forming on said principal layer an attenuated film of metal having a tensile strength per unit cross section superior to the corresponding measure of tensile strength of the material of said principal layer but of low shear strength and highly adherent to said principal layer, forming upon said film a printed resist pattern of material impervious to, and substantially non-adherent to, metal coatings applied thereon delineating a final desired conductor, depositing on the remainder of the metal surface of said film and upon the whole of said pattern an additional amount of metal of said superior tensile strength and united to the film and underlying principal layer outside said pattern with a bond over-balancing adhesion between the underlying said principal layer and the support at room temperatures and also greater than the shear strength of the said principal layer, applying traction divergently from the support collectively to an extreme part of the said principal layer, film, and last named deposited additional metal, so as to peelingly strip the so added metal, the underlying attached film and said principal layer only outside each part covered by said impervious material in said printed pattern as a unitary material from the support, so as to leave the support clean at the stripped area and leaving on the support within said printed pattern said principal layer of conductive metal and said film and so as to form the desired final electrical conductor with its edges clean and sharply defined.

2. The method of claim 1 including the further and immediately subsequent step of treating the product formed by said stripping by increasing the conductivity of the remaining part of said principal layer and augmenting its bond to said support.

3. The method of claim 1 in which the metal deposited to form the complete uninterrupted principal layer of conductive metal has a tensile strength less than the strength of adhesion thereof to the support.

4. The method of claim 3 wherein the principal layer of conductive metal is one capable of modification in situ on the support to increase its adhesion to the support, said method including a further and subsequent step consisting in augmenting the base bond of metal of the said conductor pattern after the stripping steps named.

5. The method of claim 1 wherein said first named step consists in applying the metal of said principal layer of conductive metal as a suspension in a volatile fluid binder vehicle, said method including also a further step consisting of integrating the metal of the principal layer in the residual pattern on the surface of said support and increasing the bond of the applied metal to said support after the stripping steps described.

6. The method as in claim 1 wherein said principal layer of conductive metal is a silver suspension and flux in a binder vehicle volatile below the fusing temperature of the silver and flux.

7. The method of claim 2 including depositing a highly attenuated film of metal compatible with said principal layer of conductive metal and of inherently higher tensile strength per unit cross section on the support before application of said principal layer of conductive metal, bonding said highly attenuated film to said principal layer of conductive metal and bonding the latter at least in part directly to said support.

8. The method of claim 6 including the further step of heating the product after said stripping, so as to increase the conductivity of the silver and increase its bond to the support.

9. The procedure of claim 7 wherein after said stripping the product is maintained at a temperature below the melting point of one of the two metals next adjacent the support, but sufficient to cause the uniting of the two by permeation of one at least into the other.

10. As an improved article of manufacture, a metal-clad base insulation panel stock for making printed circuit conductive patterns by tractive peeling of unprinted areas of cladding from the base, an insulation support having a surface for receiving and retaining a printed circuit conductor, a principal conductive metal coat thereover moderately bonded thereto at room temperatures and weakly coherent at room temperatures, an exceedingly attenuated film of metal highly coherent at room temperatures superimposed on said principal conductive metal coat and having a permanent bond to the latter superior to the bond between said principal conductive metal coat and said support, said last named film having also a tensile strength greater per unit of cross section than the corresponding strength of the said principal conductive metal coat, whereby a substantially non-adhesive resist pattern may be printed on said article, a metal overlay of high aggregate tensile strength superior to that of the underlying said coat and film applied over the whole of said article with a bond to exposed areas outside the resist pattern superior to the bond between the underlying materials and the support, and so that thereafter the overlay, with the so-bonded underlying materials may be tractively and peelingly stripped as a whole from said support.

11. The article of claim 10 in which an exceedingly attenuated film entirely of metal of inherently high tensile strength per unit of cross section is included on the support under said principal conductive metal coat and exceeding in attenuation the range of conventional foil coats on metal clad panel stock for etched printed circuits, and having a moderate bond to the support inferior to the bond between said film and said principal conductive metal coat but congruent with said principal conductive metal coat.

12. As an improved article of manufacture for the production of printed circuit components, the article of claim 10, a conductor pattern design thereon over said film consisting of a material substantially non-adherent to metals and impervious to aqueous electrolyte liquids and electro-deposited metals, and a stripping layer thereover and inclusive of bonding areas of said film and underlying said principal conductive metal coat outside said pattern, and adherent to said bonding areas and bonded to the latter with a bond superior to the bond of said principal conductive metal coat to said support, and having also a superior coherence and superior tensile strength, whereby the said stripping material and the materials underlying said bonding areas may be tractively stripped as a unitary material from the support, and whereby said stripping material will separate from the said pattern coat, leaving the latter and underlying material bonded to the support.

13. The structure of claim 12, wherein said principal conductive metal coat is a suspension of metal particles weakly coherent at room temperatures, mechanically applied to said surface, said film of metal superimposed thereon at least partially penetrating the said principal conductive metal coat.

14. In the production of printed electrical circuits wherein a conductive pattern of metal is formed on a base panel permanent support of insulation material, the steps of forming over the whole of a predetermined pattern area on a face of the support an uninterrupted principal conductive face body of metal of a predetermined minimum adhesion to the support at room temperatures and of low shear strength and low resistance to tear stress at room temperatures, forming over and upon said conductive face body a printed pattern of resist material substantially non-adhesive to metals and impervious to an electro-deposited metal, said pattern defining a final conductor desired on the said support, depositing a metal stripping layer of high tensile strength on the whole of said printed resist pattern and upon and united to said conductive face body around the conductor delineated in said pattern with a bond superior to the band between the conductive face body and said support, applying traction to an edge portion of the stripping layer and parts of the conductive face body bonded thereto in a direction divergent from the support, and peelingly stripping from the support the said stripping layer and attached parts of the conductive face body around the defined conductor in said resist pattern, leaving a conductor as so defined upon the support and leaving the face of the support clean and non-conductive beside and around the said conductor, and thereafter increasing the bond of the said conductor to the support.

References Cited in the file of this patent

UNITED STATES PATENTS

| | | |
|---|---|---|
| 2,582,685 | Eisler | Jan. 15, 1952 |
| 2,699,424 | Nieter | Jan. 11, 1955 |
| 2,721,153 | Hopf et al. | Oct. 18, 1955 |